(12) United States Patent
Frallicciardi et al.

(10) Patent No.: US 7,719,846 B2
(45) Date of Patent: *May 18, 2010

(54) PLATED MODULE FOR AN IC CARD

(75) Inventors: Paolo Frallicciardi, Salerno (IT); Edoardo Visconti, Margliano (IT)

(73) Assignee: Incard SA, Geneva (CH)

( * ) Notice: Subject to any disclaimer, the term of this patent is extended or adjusted under 35 U.S.C. 154(b) by 404 days.

This patent is subject to a terminal disclaimer.

(21) Appl. No.: 11/618,364

(22) Filed: Dec. 29, 2006

(65) Prior Publication Data

US 2007/0153487 A1 Jul. 5, 2007

(30) Foreign Application Priority Data

Dec. 30, 2005 (EP) .................................. 05028725

(51) Int. Cl.
H05K 1/14 (2006.01)
(52) U.S. Cl. ....................................... 361/737; 361/736
(58) Field of Classification Search ................. 361/737, 361/760, 727, 736
See application file for complete search history.

(56) References Cited

U.S. PATENT DOCUMENTS

| | | | | |
|---|---|---|---|---|
| 5,671,525 A | * | 9/1997 | Fidalgo | ........................ 29/600 |
| 5,834,755 A | | 11/1998 | Haghiri-Tehrani et al. | .. 235/492 |
| 6,076,737 A | | 6/2000 | Gogami et al. | ............... 235/492 |
| 6,561,432 B1 | * | 5/2003 | Vedder et al. | ................ 235/492 |
| 6,964,377 B1 | * | 11/2005 | Haghiri et al. | ............... 235/492 |
| 7,264,172 B2 | * | 9/2007 | Amiot et al. | ................. 235/486 |
| 7,352,588 B2 | * | 4/2008 | Nishizawa et al. | ........... 361/737 |
| 7,559,469 B2 | * | 7/2009 | Noda et al. | ................... 235/441 |
| 2003/0016507 A1 | | 1/2003 | Fischer et al. | ................ 361/737 |
| 2006/0205280 A1 | * | 9/2006 | Nishizawa et al. | ........... 439/630 |

FOREIGN PATENT DOCUMENTS

| | | |
|---|---|---|
| DE | 101 01 280 | 7/2002 |
| FR | 2 634 095 | 1/1990 |

* cited by examiner

*Primary Examiner*—Jinhee J Lee
*Assistant Examiner*—Yuriy Semenenko
(74) *Attorney, Agent, or Firm*—Lisa K. Jorgenson; Allen, Dyer, Doppelt, Milbrath & Gilchrist, P.A.

(57) ABSTRACT

A plated module is for an IC card and includes a printed circuit having a plurality of conductive areas, delimited by a network of insulating channels, for covering an integrated circuit chip intended to be hosted in a recess of a plastic support of the IC card. At least some of the conductive areas are connected to a corresponding contact points of the integrated circuit chip. At least some of the conductive areas are linked to corresponding extended areas by one or more bridges. The conductive areas are separated from the extended areas by an insulating channel crossed by the bridges. The insulating channels surround the conductive areas as a protection frame for the contact points. At least a major side of at least one of the conductive areas may be curved. Several of the advanced extended areas form a rounded border of the plated module.

12 Claims, 4 Drawing Sheets

PLATED MODULE FOR AN IC CARD

FIELD OF THE INVENTION

The present invention relates to a plated module for an IC card including a printed circuit comprising a plurality of conductive areas, delimited by a network of insulating channels, intended for covering an integrated circuit chip.

BACKGROUND OF THE INVENTION

As is well known, a plated or protective module is generally formed by two elements: an integrated circuit chip, and a printed circuit over the chip. With reference to FIG. 1, a plated module comprising a printed circuit 2 and an integrated circuit chip 3, is represented and globally indicated with numeral reference 20.

More particularly, the printed circuit 2 comprises a plurality of conductive areas a1, . . . , an, generally glued through an epoxy resin 9. The integrated circuit chip 3 is fixed and electrically connected through wires bonding beneath the printed circuit 2, before being sealed in a recess 6 of a generic plastic support 1, as schematically represented in FIG. 2. The electrical connections are clearly shown in FIGS. 1 and 3, representing respectively a top view of the printed circuit 2, sealed inside the recess 6 with the integrated circuit chip 3 beneath, and the corresponding lateral cross section.

A plurality of bond wires w1, . . . , wn connects some or all of the conductive areas a1, . . . , ak (if all, n=k) to the integrated circuit chip 3 at a plurality of contact points c1, . . . , ck. These contact points c1, . . . , ck provide communication connection between an external read write device 4 and the integrated circuit chip 3.

Generally, the plastic support 1, in which the plated module 20 is hosted, may be kept by the user in a wallet or envelope that might be protective, subject to bending or stressing forces on the plastic support 1 itself. Therefore, in order to avoid breakage, the integrated circuit chip 3 is restricted to only a few millimeters in size and is protected through the printed circuit 2 from physical pressures and static electricity.

More particularly, to hold the integrated circuit chip 3 assembled with the printed circuit 2, the recess 6 is milled into the plastic support 1 using a CNC machine with multiple drill bits, the dimension and location of the recess 6 being carefully controlled to meet with ISO standards.

Nevertheless, since the plastic support 1 is usually kept by hand and hidden in a wallet, it is subject to damage and stress mainly with respect to the printed circuit 2 and the integrated circuit chip 3, especially around the recess 6 wherein they lie. More particularly, when the plastic support 1 is deformed or stressed, the forces act in proximity to the external circumference of the recess 6, sometimes causing the partial detaching of the integrated circuit chip 3 from the plastic support 1.

Even if these forces do not cause the detaching, the contact points c1 . . . ck may be damaged, causing the communication between the integrated circuit chip 3 and the corresponding external read write device 4 to fail.

SUMMARY OF THE INVENTION

A first aim of the present invention is that of providing a plated module resistant to forces due to deforming, especially reducing the effect of these forces in proximity of the recess of a plastic support wherein the printed circuit and the integrated circuit chip reside, safeguarding the contact points that connect the conductive areas of the printed circuit to the respective bonding wires.

A further aim of the invention is to provide a plated module able to absorb forces, especially near the border of recess, for protecting the contact points that connect the conductive areas of the printed circuit to respective bonding wires.

One embodiment relates to a plated module for an IC card including a printed circuit and comprising a plurality of conductive areas delimited by a network of insulating channels, for covering an integrated circuit chip hosted in a recess of a plastic support of the IC card, at least some of the conductive areas being connected to a corresponding contact points of the integrated circuit chip, and wherein at least some of the conductive areas are linked to a corresponding extended area by one or more bridges.

The surface of the conductive areas of the plated module is enlarged in order to provide extended conductive areas, linked to at least some of the conductive areas by a conductive bridge.

Another embodiment relates to an IC card comprising a plated module, a plastic support with a recess and an integrated circuit chip, the plated module being structured to cover the integrated circuit chip through a plurality of conductive areas, with at least some of the conductive areas being connected to a corresponding contact points of the integrated circuit chip.

BRIEF DESCRIPTION OF THE DRAWINGS

The features and advantages of the invention will be apparent from the following description of embodiments thereof, given by way of non-limitative example with reference to the accompanying drawings.

DETAILED DESCRIPTION OF THE PREFERRED EMBODIMENTS

Figure 1:
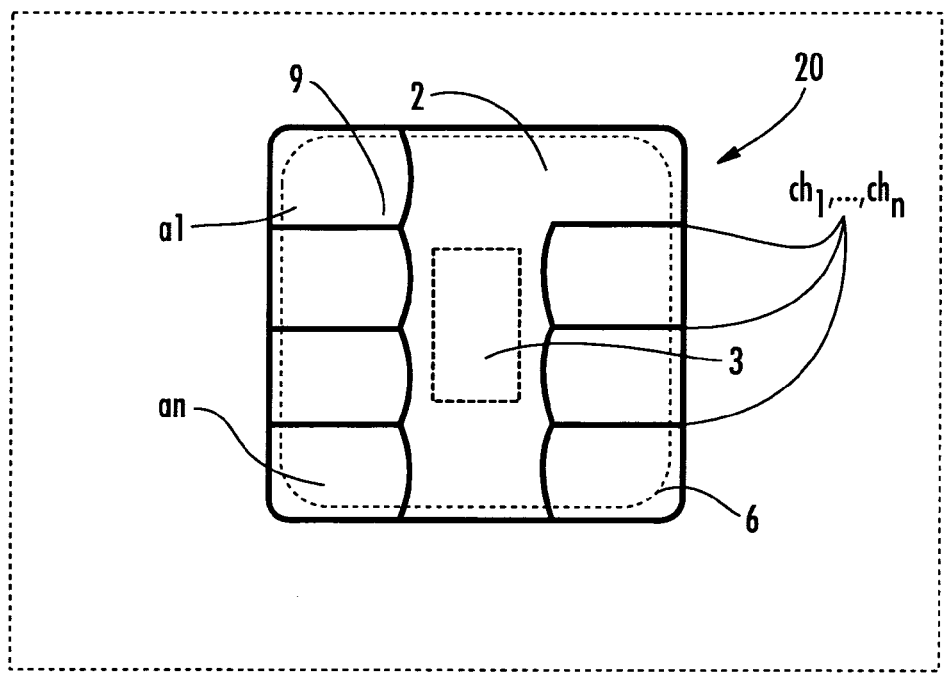
FIG. 1 schematically represents, in a top view, a plated module according to the prior art.
Figure 2:
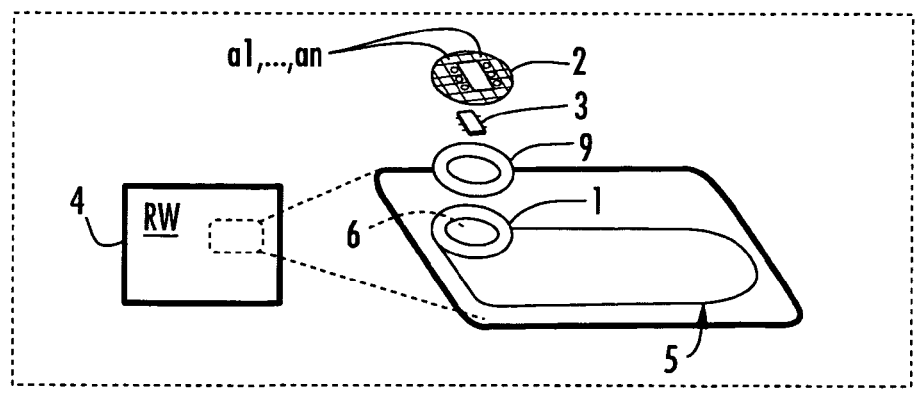
FIG. 2 schematically represents, in a perspective exploded view, a plastic support wherein a plated module resides, according to the prior art.
Figure 3:
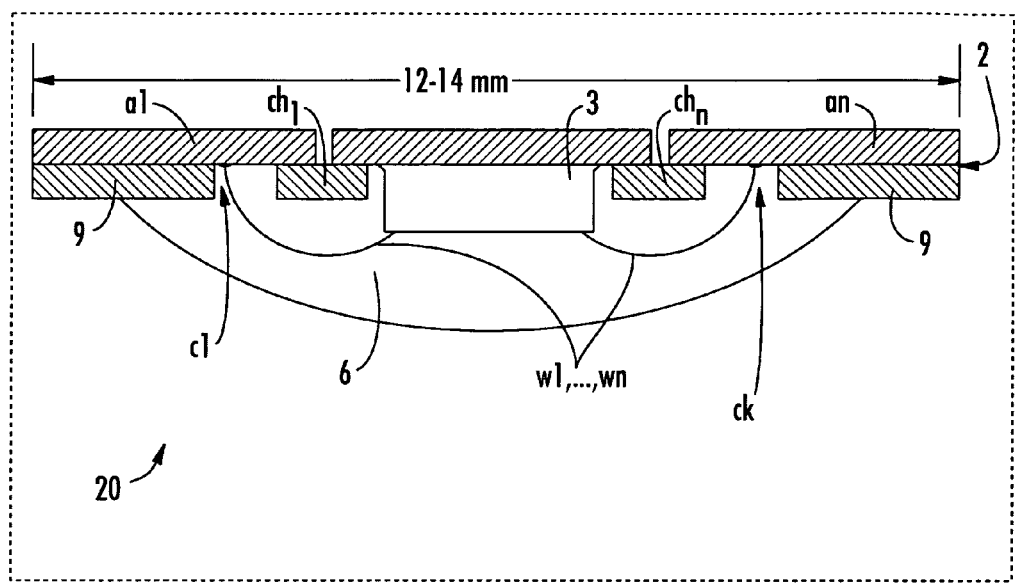
FIG. 3 schematically represents, in a lateral view, the plated module of FIG. 1 according to the prior art.
Figure 4:
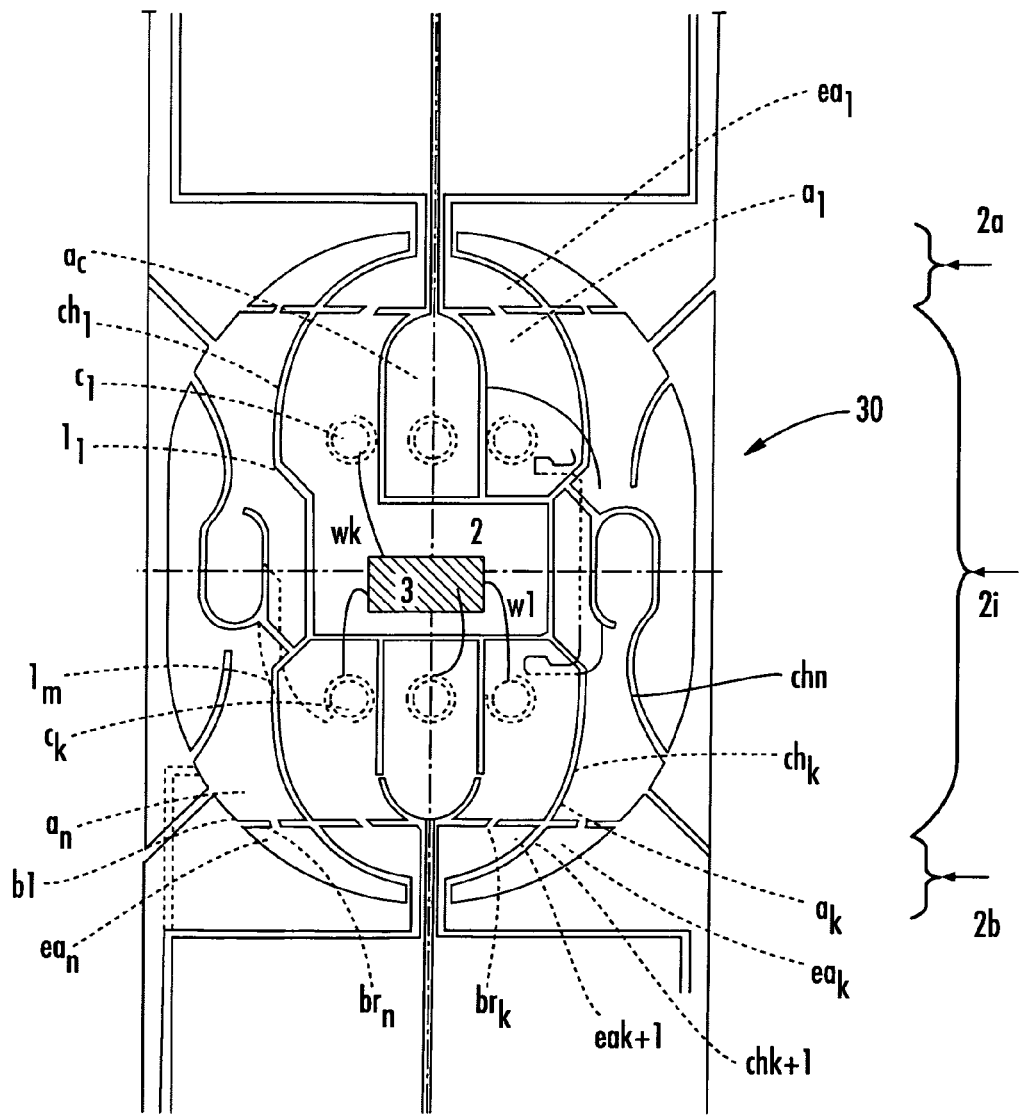
FIG. 4 schematically represents a plated module according to the present invention.

With more specific reference to FIG. 4 there is shown and is globally indicated with 30 a plated module including a printed circuit 2 comprising a plurality of conductive areas $a_1, \ldots, a_n$, delimited by a network of insulating channels $ch_1, \ldots, ch_n$, intended for covering an integrated circuit chip 3. More particularly, at least some of the conductive areas $a_1, \ldots, a_n$ are connected through wire bonding $w_1, \ldots, w_k$ to a corresponding contact point $c_1, \ldots, c_k$ on the integrated circuit chip 3, so to provide communication connection between an external read write device 4 and the integrated circuit chip 3.

At least some of the conductive areas $a_1, \ldots, a_n$ are linked to a corresponding extended or external area $ea_1, \ldots, ea_n$ by one or more bridges $br_1, \ldots, br_n$. A plurality of additional insulating channel $c_{k+1}$ delimits an extended area $ea_k$ from a nearby conductive area $a_1, \ldots, a_n$ or from a nearby extended area $ea_1, \ldots, ea_k$. The insulating channels $ch_1, \ldots, ch_k$ surround the conductive areas $a_1, \ldots, a_n$ as a frame, so to protect the connection with the corresponding contact point $c_1, \ldots, c_k$.

More particularly, the extended areas $ea_1, \ldots, ea_k$ are composed of the same material used for the corresponding conductive areas $a_1, \ldots, a_n$. Also the bridge $br_1, \ldots, br_n$ may comprise the same material used for the conductive areas $a_1, \ldots, a_n$, rendering manufacturing easier for the plated module 30.

More particularly, an insulating channel $b_1$, divides the conductive areas $a_1, \ldots, a_n$ from the nearby extended or external areas $ea_1, \ldots, ea_m$, with the insulating channel b1 crossed by a plurality of bridges $br_1, \ldots, br_n$. The bridges $br_1, \ldots, br_n$ on the insulating channel b1 act as a mechanical bypass between an internal part (2i), including the conductive areas $a_1, \ldots, a_n$, and a border parts (2a, 2b), comprising the extended areas $ea_1, \ldots, ea_m$. The mechanical bypass is intended to render the border parts (2a, 2b) flexible with respect to the internal part (2i), and to absorb forces on the plastic support 1, as a flexible wing in favor of the static internal part (2i).

More particularly, the internal part (2i) remains adherent to the recess 6, safeguarding the wire bonding between the conductive areas ($a1, \ldots, an$) and the contact points ($c1, \ldots, ck$) on the integrated circuit 3.

Advantageously, the plated module 30 has a rounded border formed by, at least, a couple of the advanced extended areas $ea_1, ea_n$. The advanced extended areas $ea_1, \ldots, ea_n$ forming the round border of the plated module 30 are linked to corresponding conductive areas $a_1, \ldots, a_n$.

Advantageously, these conductive areas are, associated with the integrated circuit chip with corresponding contact points $c_1, \ldots, c_k$. The advanced extended areas $ea_1, \ldots, ea_n$ forming the round border, circle or wrap around other extended areas $ea_1, \ldots, ea_n$, especially those extended areas associated with the conductive areas $a_1, \ldots, a_n$ linked through the contact points $c_1, \ldots, c_k$. In other words the extended areas $ea_1, \ldots, ea_n$ and the advanced extended areas $ea_1, ea_n$ form together corresponding border parts 2a, 2b at opposite sides of the core internal part 2i of the module. These border parts 2a, 2b may be considered wings with respect to the core internal part 2i and are linked to such an internal part 2i through the bridges $br_1, \ldots, br_n$ aligned along the insulating channels b1, b2 thus forming sort of weakening and separation lines clearly visible in FIG. 4. In this way, the forces acting on the border of the recess 6 are distributed especially on extended area $ea_1, \ldots, ea_n$ that are passive with respect to the functioning of the integrated circuit 3.

More particularly, both the border parts 2a, 2b of the plated module 30 may be rounded by corresponding couple of advanced extended areas $ea_1, \ldots, ea_m$. The conductive areas $a_1, a_n$ have at least a major side that is curved. They have also a minor side curved, rounding and protecting the connection with the corresponding contact point $c_1, \ldots, c_k$. At least one central conductive area $a_c$ has a semi-circumferential side.

According to another embodiment, the extended areas $ea_1, \ldots, ea_n$ are formed by a material different from that used for the corresponding conductive area $a_1, \ldots, a_n$. For example, the extended areas $ea_1, \ldots, ea_n$ may be formed by epoxy resin 9 filling the border parts 2a, 2b and absorbing forces acting on the border of the plated module 30.

Moreover, the epoxy resin 9, distributed on the border parts 2a, 2b, increases the adherence of the conductive areas $a_1, a_n$ on the internal part 2i. Also the bridges $br_1, \ldots, br_k$, are, according to this embodiment, in epoxy resin 9.

According to another embodiment, the extended areas $ea_1, \ldots, ea_n$ are formed by a material different from the epoxy resin, for example, an insulating or conductive material for easy coupling with the recess 6 and resistant to forces and pressures.

Figure 5:
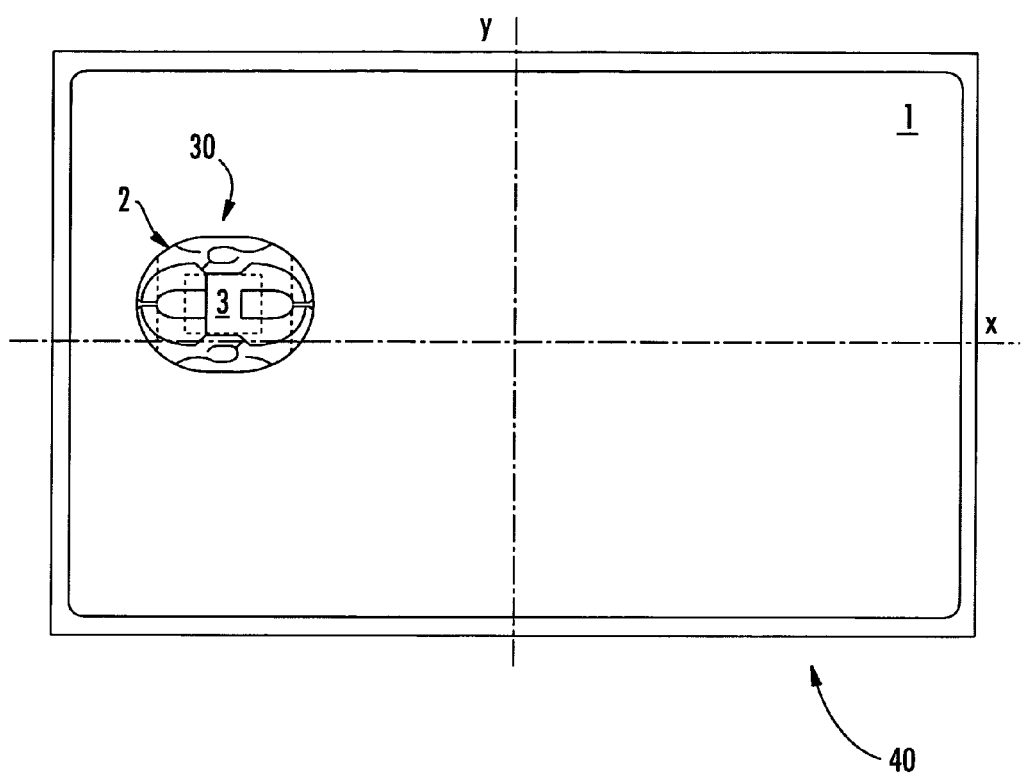
FIG. 5 schematically represents an IC card comprising a plated module according to the present invention.

An IC card may comprise a plated module. With specific reference to FIG. 5 there is shown and is globally indicated with 40 an IC Card comprising a plated module 30 including a printed circuit 2 with a plurality of conductive areas $a_1, \ldots, a_n$, delimited by a network of insulating channels $ch_1, \ldots, ch_n$, intended for covering an integrated circuit chip 3.

More particularly the IC card (40) also comprises a plastic support 1 with a recess 6, an integrated circuit chip 3, and with the plated module 30 covering the integrated circuit chip (3).

A major surface of the plastic support 1 has a major axis x and a minor axis y. Advantageously, the recess 6 on the plastic support 1 of the IC card 40 is offset with respect to the major axis x and/or the minor axis y of the plastic support 1.

More particularly, the x and y axes delimit a quadrant q of the major surface of the plastic support 1. Advantageously, the recess 6 of the IC Card 40 is inside the quadrant q of the major surface of the plastic support 1.

The plated module 30 is resistant to forces due to bending or deforming, especially reducing the effect of these forces in proximity of the recess 6 of the plastic support 1 wherein the printed circuit 2 and the integrated circuit chip 3 reside. The plurality of extended areas in fact, absorb forces near the border of recess 6 and protects the contact points $c1 \ldots ck$ that connect the conductive areas $a1, \ldots, an$ of the printed circuit 1 to the respective bonding wires $w1, \ldots, wn$.

A possible break of an extended area $ea_1, \ldots, ea_n$, its detachment from the recess 6 or a dissociation with a corresponding conductive area does not cause the failure of the plated support 30. The concentric disposition of the advanced extended areas $ea_1, \ldots, ea_n$ as a protection of the extended areas $ea_1, \ldots, ea_n$ linked to conductive areas directly associated with the integrated circuit chip 3, preserve the functioning of the integrated circuit chip 3. Other related aspects are disclosed in copending patent application entitled: IC CARD WITH IMPROVED PLATED MODULE, application Ser. No. 11/618,413, filed concurrently herewith.

That which is claimed is:

1. A module for an integrated circuit (IC) card comprising a support with a recess therein, the module comprising:
    an IC chip for positioning in the recess of the support and having a plurality of contact points; and
    a printed circuit for covering said IC chip and comprising
        a network of insulating channels,
        a plurality of conductive areas delimited by said network of insulating channels, at least one of the conductive areas being connected to a corresponding contact point of said IC chip,
        at least one extended conductive area, and
        at least one bridge linking the at least one extended conductive area to a corresponding conductive area,
        wherein said at least one extended conductive area comprises a plurality of advanced extended areas, and
        wherein first advanced extended areas form a first rounded border of the module.

2. The module according to claim 1 wherein said at least one bridge is conductive.

3. The module according to claim 1 wherein said at least one extended conductive area is separated from the corresponding conductive area by an insulating channel crossed by said at least one bridge.

4. The module according to claim 1 wherein said network of insulating channels surround said plurality of conductive areas as a protection frame for said plurality of contact points.

5. The module according to claim 4 wherein at least one major side of at least one of said plurality of conductive areas is curved.

6. The module according to claim 1 wherein second advanced extended areas form a second rounded border of the module opposite the first rounded border.

7. The module according to claim 1 wherein said plurality of advanced extended areas further comprises third advanced extended areas; and wherein said first and second advanced extended areas wrap around said third advanced extended areas.

8. The module according to claim 1 wherein said first and second advanced extended areas are linked to conductive areas not associated with contact points.

9. The module according to claim 1 wherein said plurality of conductive areas comprises at least one central conductive area having a semi-circular side.

10. A module for an integrated circuit (IC) card comprising a support with a recess therein, the module comprising:

an IC chip for positioning in the recess of the support and having a plurality of contact points; and a printed circuit for covering said IC chip and comprising a network of insulating channels, a plurality of conductive areas delimited by said network of insulating channels and at least some of said conductive areas being connected to corresponding contact points of said IC chip, a plurality of extended conductive areas comprising a plurality of advanced extended areas, including first advanced extended areas that form a first rounded border of the module, and second advanced extended areas that form a second rounded border of the module opposite the first rounded border, and at least one conductive bridge linking each extended conductive area to a corresponding conductive area.

11. The module according to claim 10 wherein said plurality of advanced extended areas further comprises third advanced extended areas; and wherein said first and second advanced extended areas wrap around said third advanced extended areas.

12. The module according to claim 10 wherein said first and second advanced extended areas are linked to conductive areas not associated with contact points.

\* \* \* \* \*

UNITED STATES PATENT AND TRADEMARK OFFICE
CERTIFICATE OF CORRECTION

PATENT NO.        : 7,719,846 B2
APPLICATION NO.   : 11/618364
DATED             : May 18, 2010
INVENTOR(S)       : Frallicciardi et al.

It is certified that error appears in the above-identified patent and that said Letters Patent is hereby corrected as shown below:

Column 2, Line 10    Delete: "to a"
                     Insert: --to--

Column 2, Line 23    Delete: "to a"
                     Insert: --to--

Column 2, Line 30    Delete: "of non-limitative"
                     Insert: --of a non-limitative--

Column 3, Line 28    Delete: "are,"
                     Insert: --are--

Column 3, Line 47    Delete: "by corresponding"
                     Insert: --by a corresponding--

Column 3, Line 48    Delete: "$ea_m$"
                     Insert: --$ea_n$--

Signed and Sealed this

Fourteenth Day of September, 2010

David J. Kappos
*Director of the United States Patent and Trademark Office*